US008711020B2

(12) United States Patent
Wulff et al.

(10) Patent No.: US 8,711,020 B2
(45) Date of Patent: Apr. 29, 2014

(54) ANALOGUE-TO-DIGITAL CONVERTER

(75) Inventors: Carsten Wulff, Vikhammer (NO); Ola Bruset, Sjetnemarka (NO); Werner Luzi, Raelingen (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 13/985,275

(22) PCT Filed: Feb. 14, 2012

(86) PCT No.: PCT/GB2012/050321
§ 371 (c)(1),
(2), (4) Date: Oct. 21, 2013

(87) PCT Pub. No.: WO2012/110796
PCT Pub. Date: Aug. 23, 2012

(65) Prior Publication Data
US 2014/0035770 A1 Feb. 6, 2014

(30) Foreign Application Priority Data

Feb. 14, 2011 (GB) .................................. 1102562.4

(51) Int. Cl.
*H03M 3/00* (2006.01)
(52) U.S. Cl.
USPC ............ 341/143; 341/118; 341/120; 341/155
(58) Field of Classification Search
USPC ................... 341/118, 120, 143, 155
See application file for complete search history.

(56) References Cited

U.S. PATENT DOCUMENTS

| | | | | |
|---|---|---|---|---|
| 5,121,119 A * | 6/1992 | Higuchi et al. | ............... | 341/120 |
| 6,400,295 B1 * | 6/2002 | Van Herzeele | ............... | 341/143 |
| 6,639,539 B1 * | 10/2003 | Loreck | ............ | 341/155 |
| 6,924,757 B2 * | 8/2005 | Adams et al. | ................ | 341/143 |
| 6,927,718 B2 * | 8/2005 | Koch | ............ | 341/143 |
| 7,551,109 B1 | 6/2009 | Ashmore | | |
| 7,671,774 B2 * | 3/2010 | Braswell | ............ | 341/143 |
| 8,199,038 B2 * | 6/2012 | Kim et al. | ............ | 341/143 |
| 8,384,575 B1 * | 2/2013 | Braswell | ............ | 341/143 |
| 8,502,719 B2 * | 8/2013 | Ashburn et al. | ............ | 341/143 |
| 2008/0272946 A1 * | 11/2008 | Melanson | ............ | 341/143 |
| 2009/0278719 A1 * | 11/2009 | Braswell | ............ | 341/143 |
| 2012/0200440 A1 * | 8/2012 | Okada et al. | ............ | 341/143 |
| 2012/0229316 A1 * | 9/2012 | Loeda et al. | ............ | 341/143 |

FOREIGN PATENT DOCUMENTS

GB 2292028 2/1996

OTHER PUBLICATIONS

Notification of Transmittal of International Search Report and Written Opinion for PCT/GB2012/050321 mailed Jun. 13, 2012.

(Continued)

*Primary Examiner* — Linh Nguyen
(74) *Attorney, Agent, or Firm* — Koppel, Patrick, Heybl & Philpott

(57) ABSTRACT

An integrated-circuit, continuous-time, sigma-delta analogue-to-digital converter has a single-ended analogue input, a converter reference input, and a ground connection. The converter has a resistor-capacitor integrator arranged to receive the single-ended analogue input. The integrator comprises a differential amplifier. The converter also has a clocked comparator connected to an output from the integrator, and circuitry arranged so that reference inputs to the amplifier and to the comparator can be maintained at a common voltage derived from the converter reference input.

9 Claims, 1 Drawing Sheet

(56) References Cited

OTHER PUBLICATIONS

Doldan, et al. "A Continuous-Time Incremental Analog to Digital Converter" Integrated Circuits and Systems Design, 2002. Proceedings. 15th Symposium on Sep. 9-14, 2002, Piscataway, NJ, IEEE, Sep. 9, 2002, pp. 62-67.

UK Combined Search and Examination Report for Application No. GB1202499.8 dated Apr. 13, 2012.
UK Intellectual Property Office, Notification of Grant: Patent Serial No. GB2485703 (Application No. GB1202499.8; Priority GB1102562), dated Jul. 2, 2013; & UK Patent GB2485703 dated Jul. 31, 2013.

* cited by examiner

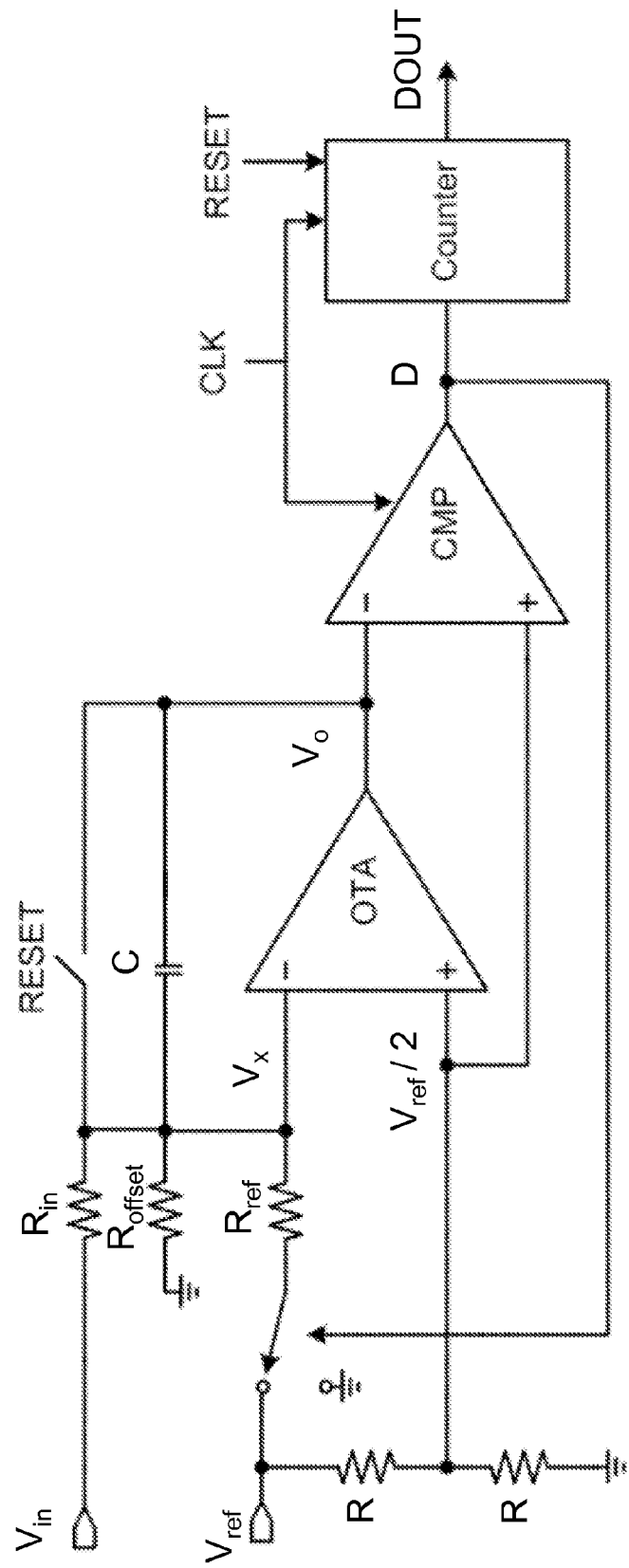

ANALOGUE-TO-DIGITAL CONVERTER

This invention relates to a continuous-time, incremental, sigma-delta analogue-to-digital converter (ADC).

Sigma-delta ADCs are widely used to digitise analogue signals. A sigma-delta ADC comprises an integrator and comparator in a feedback loop, and is arranged to convert a variable analogue input to a digital output. A first-order converter has one feedback loop, while second- and higher-order ADCs have multiple loops.

The output of a sigma-delta ADC is a pulse-density modulated (PDM) bit-stream, in which a high instantaneous input signal is represented as a stream of predominantly binary 1's (with few binary 0's), while a low instantaneous input signal is represented with mainly 0's (and few 1's). The PDM output stream may be sent to a filter, such as a counter which counts the number of 1's over a sample window and gives a single numerical output value for that sample window.

Sigma-delta ADCs are widely used to digitise continuous, analogue signals, such as audio signals in telecommunications applications. They are also used to digitise analogue outputs from measuring equipment, such as environmental sensors or a voltage meter. These latter applications typically require higher numerical resolution than audio sampling, but much lower update rates, since the analogue input does not change rapidly. Incremental ADCs are commonly used in such situations. These are arranged to have their circuitry (e.g. integrator) reset between each sampling operation to produce more accurate (but slower) readings.

Sigma-delta ADCs may be designed to operate in discrete-time (DT) or continuous-time (CT). A discrete-time ADC first samples the analogue input at a clock rate, e.g. using a switched capacitor, and then passes the samples to the integrator for digitising. In a continuous-time ADC, the analogue input is passed directly to the integrator, and sampling does not occur until the comparator stage. CT-ADCs can have a lower power consumption than DT-ADCs, as well as inherently better anti-aliasing characteristics.

An incremental, continuous-time, first-order sigma-delta ADC is described in: "A Continuous-Time Incremental Analog to Digital Converter", Doldán et al., sbcci, pp. 62, 15th Symposium on Integrated Circuits and Systems Design, 2002. It receives a differential analogue input from a pair of electrodes and produces a digital output. It is based around a fully-differential, operational transconductance amplifier-capacitor (OTA-C) integrator.

The described converter circuit uses only one capacitor. This is desirable in that the circuit would have a relatively small footprint in an integrated circuit design. However, the described ADC is linear over only a limited input range; in particular, it does not offer rail-to-rail linearity. Linearity over a large input range is desirable for obtaining an accurate digital output from wide-ranging analogue inputs, without the need for costly linearity-correction processing.

The present invention seeks to mitigate this shortcoming.

From one aspect, the invention provides an integrated-circuit, continuous-time, sigma-delta analogue-to-digital converter having a single-ended analogue input, a converter reference input, and a ground connection, wherein the converter comprises:

a resistor-capacitor integrator arranged to receive the single-ended analogue input, wherein the integrator comprises a differential amplifier having an amplifier reference input;

a clocked comparator arranged to receive an output from the integrator and having a comparator reference input; and circuitry arranged so that the amplifier reference input and the comparator reference input can be maintained at a common voltage derived from the converter reference input.

It will be appreciated by those skilled in the art that an ADC in accordance with the invention can provide near rail-to-rail linearity in a small chip-area, by providing a single-ended input to an RC integrator, and by maintaining a common reference voltage between the comparator and the amplifier in the RC integrator.

In preferred embodiments, the RC integrator comprises a single capacitor, which results in a particularly small chip area.

The said common voltage is preferably half of the converter reference input voltage. The circuitry preferably comprises a voltage divider between the converter reference input and ground, the output of which is connected to the amplifier reference input and to the comparator reference input. The voltage divider preferably comprises two equal resistors. The amplifier reference input is preferably a non-inverting input to the differential amplifier.

It will be appreciated that the ground connection is not necessarily connected to earth or maintained at an earth potential, but nonetheless provides a reference or nominal "zero" voltage for the converter.

The differential amplifier may be, or may comprise, an operational amplifier, but is preferably an operational transconductance amplifier (OTA).

The converter preferably comprises circuitry arranged so that, in use, the current flowing into a second input to the amplifier depends on: (i) the voltage at the single-ended analogue input, (ii) the converter reference voltage, and (iii) the output state of the clocked comparator. The second input is preferably an inverting input to the amplifier. The converter may comprise a clock input which is used by the comparator to define an integration step. The clock input may receive a clock signal derived from an external oscillator, for example.

The circuitry may comprise means arranged to switch the voltage at a point in the circuitry between two values in dependence on the binary output of the comparator. This may comprise a one-bit digital-to-analogue converter or multiplexer. One of the values is preferably ground. The other value is preferably the converter reference voltage.

In some embodiments, the circuitry comprises an arrangement of three resistors, wherein a first end of the first (input) resistor is connected to the single-ended analogue input, a first end of the second (offset) resistor is connected to ground, and a first end of the third (reference) resistor is switchably connectable to the converter reference input or to ground. The second ends of the three resistors are each connected to the second input to the amplifier. The circuitry is preferably arranged such that the switching of the voltage at the first end of the reference resistor is controlled in dependence on the binary output of the comparator.

Alternatively, the circuitry may comprise an arrangement of four resistors, wherein a first end of the first (input) resistor is connected to the single-ended analogue input, a first end of the second (offset) resistor is connected to ground, a first end of the third (ground-reference) resistor is connected to ground, and a first end of the fourth (reference-input) resistor is connected to the converter reference input or to ground. The second ends of the ground-reference resistor and the reference-input resistor are switchably connectable to the second input to the amplifier such that one or other (but preferably not both) of the second ends is connected at a time. The second ends of the input resistor and offset resistor are also connected to the second input to the amplifier. The circuitry is preferably arranged such that the switching between the ground-reference resistor and reference-input resistor is controlled in dependence on the binary output of the comparator. The ground-reference resistor and the reference-input resistor preferably have the same nominal value.

The terms "capacitor" and "resistor" should be understood as respectively encompassing any suitable charge-storing and current-impeding arrangement or means. They do not necessarily need to be discrete components.

Any or all of the input, offset and reference resistors may be fixed or variable. In some embodiments, the input and offset resistors are variable, and the converter comprises means for receiving an input representative of a desired gain or mid-scale (or both), and for adjusting the input and offset resistors so that the converter provides the desired gain or mid-scale. For example, in some embodiments, a microcontroller (which may be external, or integrated with the converter on a single chip) can control the values of the input resistor and/or offset resistor, to implement different gain functions.

For an ideal implementation (i.e. ignoring processing errors and other errors that might affect the gain), the gain of the converter may be represented as the lowest converter input voltage, V_max, at which the output of the comparator is always high. Similarly, the mid-scale of the converter represents the single-ended converter input voltage, V_midscale, at which the comparator output alternates equally between high and low.

In some embodiments the gain or mid-scale (or both) of the converter is a function of the ratio, a, of the input resistor value to the reference resistor value, and of the ratio, b, of the offset resistor value to the reference resistor value. For example, in some embodiments, $$V\_max = V\_ref*[a+b+(b*a)]/[2*b], \text{ and}$$

$$V\_midscale = V\_ref*[a+b]/[2*b],$$

where V_ref is the converter reference voltage.

This can be advantageous in that the gain or mid-scale (or both) can be determined by the ratios of resistors, and such ratios are more robust to process variation during integrated-circuit fabrication than are absolute resistor values. Accuracies of around 0.5% or better are possible using such a ratio-based approach.

Such an arrangement is believed to be new and inventive in its own right, and thus from a further aspect the invention provides an integrated-circuit, continuous-time, sigma-delta analogue-to-digital converter having a single-ended analogue input, a converter reference input, and a ground connection, wherein the converter comprises an input resistor having a first end connected to the single-ended analogue input, and an offset resistor having a first end connected to ground, wherein the second ends of the input and offset resistors are connected to an input to a differential amplifier in an RC integrator circuit, wherein the input to the differential amplifier is also selectably connectable through a reference resistor to either the converter reference input or to ground, and wherein the gain of the converter is determined as a function of the ratio of the input resistor value to the reference resistor value and of the ratio of the offset resistor value to the reference resistor value.

A first end of a reference resistor may be connected to switching means arranged to maintain the voltage at the first end of the reference resistor at either ground or a voltage at the converter reference input, with the second end of the reference resistor being connected to the differential amplifier input.

Alternatively, the converter may comprise first and second resistors typically of equal nominal resistance value, a first end of the first reference resistor being maintained at ground and a first end of the second reference resistor being maintained at a voltage at the converter reference input, with the input to the differential amplifier being connected to switching means arranged to connect the input either to the second end of the first reference resistor or to the second end of the second reference resistor.

Preferably the mid-scale of the converter is determined as a further function of the ratio of the input resistor value to the reference resistor value and of the ratio of the offset resistor value to the reference resistor value.

In embodiments of any of the above aspects, the converter may comprise a counter arranged to receive the binary output of the comparator. The counter may receive a clock signal and be arranged to count for how many clock cycles the output of the comparator is high (or low) over a time period. Preferably the same clock is used for the clocked comparator and for the counter. The time period may be a predetermined number of clock cycles, such as 1024 cycles.

The converter is preferably an incremental converter. It preferably therefore includes a reset mechanism for resetting the integrator. This may, for example, comprise means for discharging a capacitor of the RC integrator, such as a switch arranged in parallel with the capacitor. The converter may also comprise a reset mechanism for resetting a counter. The reset mechanism(s) may be controlled by a processor or by digital control logic, which may form part of the converter or be separate therefrom.

The converter may be suitable for digitising the output of a measuring instrument. It may be suitable for receiving a voltage signal from a cell or battery and determining a digital representation of the voltage level.

Optional or preferred features of any of the aspects of the invention may be optional or preferred features of any of the other aspect, wherever appropriate. Some or all of the aspects may be combined in a single embodiment.

Certain preferred embodiments of the invention will now be described, by way of example only, with reference to the accompanying drawings, in which:

FIG. 1 is a circuit diagram of an ADC according to the invention.

FIG. 1 shows a continuous-time, incremental, sigma-delta ADC having a single capacitor C connected between the inverting input to an operational transconductance amplifier (OTA) and the single output of the OTA. The output of the OTA feeds into the negative input of a comparator (CMP).

The positive input of the comparator is connected to the non-inverting input of the OTA, and both are connected to the mid-point of a voltage-divider R-R located between a reference voltage input (V_ref) and ground, such that both are maintained at a voltage of half of the reference voltage input.

A single-ended analogue input (V_in) is connected via an input resistor R_in to the OTA's inverting input.

A ground connection is connected via an offset resistor R_offset to the OTA's inverting input.

The output of a one-bit DAC is connected via a reference resistor R_ref to the OTA's inverting input. The DAC is arranged so that it outputs the reference voltage V_ref when the output of the comparator is low, and zero (ground) when the comparator output is high.

A reset switch is situated across the terminals of the capacitor C and is arranged to close when it receives a reset command from a controller (not shown).

The output of the comparator feeds into a counter, which also receives a clock signal. The clock may be derived from an external crystal oscillator, for example. The counter outputs a bit count DOUT of clock cycles for which the comparator was high during a count period (e.g. 1024 cycles). The counter output can be received by control logic (not shown) for subsequent processing, such as affecting the behaviour of a radio transmitter or a display screen.

The counter has a reset input which causes it to reset its count to zero.

In use, when a voltage V_in (between zero and a maximum V_max) is applied to the signal input, a current flows through the OTA as the capacitor charges or discharges. When the voltage at the output of the OTA crosses V_ref/2, the output of the clocked comparator CMP will flip at the next integration step. This change in the comparator output causes the output of the one-bit DAC to flip, resulting in a reverse in the direction of current flow through the OTA.

An incremental analogue-to-digital conversion is carried out by first resetting the integrator and the counter. Then, a fixed number N of integration steps is performed, where N=2^n bits for an n-bit output resolution. E.g. for a 10-bit conversion, 1024 integration steps are performed.

After N integration steps, assuming that the voltage V_x at the OTA's inverting input equals the voltage 0.5*V_ref at its non-inverting input, the voltage V_o at the integrator output is given by:

$$V\_o(N)=[N\_c*V\_\text{ref}]-[N*A\_v*V\_\text{in})] \quad (1)$$

where
N_c=number of integration steps for which the comparator output is high;
V_ref=reference voltage;
N=number of integration steps;
A_v=voltage gain (R_ref/R_in); and
V_in =input voltage.

Rearranging equation (1) gives:

$$N\_c=[N*A\_v*V\_\text{in}/V\_\text{ref}]+[V\_o(N)/V\_\text{ref}].$$

The gain and mid-scale of the converter can be set to any desired value, according to the equations below.

The current I through the OTA from its inverting input (which is at voltage V_x) to its output (which is at voltage V_o) is given by $$I=[(V\_\text{in}-V\_x)/R\_\text{in}]-[V\_x/R\_\text{offset}]+[(1-D)*(V\_\text{ref}-V\_x)/R\_\text{ref}]-[D*V\_x/R\_\text{ref}], \quad (2)$$

where D=1 when the comparator output is high, and 0 when the output is low.

For an ideal amplifier, it can be assumed that $$V\_x=0.5*V\_\text{ref}. \quad (3)$$

R_in and R_offset can be expressed as ratios of R_ref as follows:

$$R\_\text{in}=a*R\_\text{ref, and} \quad (4)$$

$$R\_\text{offset}=b*R\_\text{ref}. \quad (5)$$

Substituting equations (3), (4) and (5) into equation (2) yields:

$$I=[(V\_\text{in}-0.5*V\_\text{ref})/(a*R\_\text{ref})]-[V\_\text{ref}/(2*b*R\_\text{ref})]+((1-D)-D)*V\_\text{ref}/(2*R\_\text{ref}). \quad (6)$$

The mid-point of the analogue-to-digital conversion occurs when the input voltage V_midscale is such that the current I is of equal value in either direction; i.e. when $$I=((1-D)-D)*V\_\text{ref}/(2*R\_\text{ref}).$$

From equation (6), this occurs when $$(V\_\text{midscale}-0.5*V\_\text{ref})/(a*R\_\text{ref})=V\_\text{ref}/(2*b*R\_\text{ref}).$$

Rearranging yields:

$$V\_\text{midscale}/V\_\text{ref}=(a+b)/(2*b). \quad (7)$$

The maximum converter output occurs when I=0 and D=1. From equation (6), this means that the maximum input voltage V_max should satisfy:

$$[(V\_\text{max}-0.5*V\_\text{ref})/(a*R\_\text{ref})]-[V\_\text{ref}/(2*b*R\_\text{ref})]=V\_\text{ref}/(2*R\_\text{ref}).$$

Rearranging yields:

$$V\_\text{max}/V\_\text{ref}=(a+b+ba)/(2*b). \quad (8)$$

Thus, the gain and mid-scale of the converter can be set arbitrarily by selecting resistor ratios a and b that satisfy equations (7) and (8).

The invention claimed is:

1. An integrated-circuit, continuous-time, sigma-delta analogue-to-digital converter having a single-ended analogue input, a converter reference input, and a ground connection, wherein the converter comprises an input resistor having a first end connected to the single-ended analogue input, and an offset resistor having a first end connected to ground, wherein the second ends of the input and offset resistors are connected to an input to a differential amplifier in an RC integrator circuit, wherein the input to the differential amplifier is also selectably connectable through a reference resistor to either the converter reference input or to ground, and wherein the gain of the converter is determined as a function of the ratio of the input resistor value to the reference resistor value and of the ratio of the offset resistor value to the reference resistor value.

2. The analogue-to-digital converter of claim 1, wherein a first end of the reference resistor is connected to a switching arrangement, arranged to maintain the voltage at the first end of the reference resistor at either ground or a voltage at the converter reference input, with the second end of the reference resistor being connected to the differential amplifier input.

3. The analogue-to-digital converter of claim 1, comprising first and second reference resistors and configured to maintain a first end of the first reference resistor at ground and to maintain a first end of the second reference resistor at a voltage at the converter reference input, with the input to the differential amplifier being connected to a switching arrangement, arranged to connect the input either to the second end of the first reference resistor or to the second end of the second reference resistor.

4. The analogue-to-digital converter of claim 3, wherein the first and second reference resistors have the same nominal value.

5. The analogue-to-digital converter of claim 1, wherein the mid-scale of the converter is determined as a further function of the ratio of the input resistor value to the reference resistor value and of the ratio of the offset resistor value to the reference resistor value.

6. The analogue-to-digital converter of claim 1, comprising a clocked comparator arranged to receive an output from the integrator, and a counter arranged to receive the binary output of the comparator.

7. The analogue-to-digital converter of claim 6, wherein the counter is arranged to receive a clock signal and to count for how many clock cycles the output of the comparator is high, or to count for how many clock cycles the output of the comparator is low, over a time period, and wherein the converter is arranged so that the counter and the comparator receive the same clock signal.

8. The analogue-to-digital converter of claim 1, wherein the converter is an incremental converter.

9. The analogue-to-digital converter of claim 1, wherein the input resistor and the offset resistor are variable, and the converter is arranged to receive an input representative of a desired gain or mid-scale, and to adjust the input and offset resistors so that the converter provides the desired gain or mid-scale.

* * * * *